United States Patent
Cheah et al.

(10) Patent No.: US 10,916,524 B2
(45) Date of Patent: Feb. 9, 2021

(54) STACKED DICE SYSTEMS

(71) Applicant: Intel Corporation, Santa Clara, CA (US)

(72) Inventors: Bok Eng Cheah, Bukit Gambir (MY); Jackson Chung Peng Kong, Tanjung Tokong (MY); Kooi Chi Ooi, Glugor (MY); Ping Ping Ooi, Butterworth (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/473,570

(22) PCT Filed: Nov. 29, 2017

(86) PCT No.: PCT/US2017/063663
§ 371 (c)(1),
(2) Date: Jun. 25, 2019

(87) PCT Pub. No.: WO2018/125486
PCT Pub. Date: Jul. 5, 2018

(65) Prior Publication Data
US 2020/0083194 A1   Mar. 12, 2020

(30) Foreign Application Priority Data
Dec. 29, 2016  (MY) ............................... 2016704874

(51) Int. Cl.
*H01L 25/065* (2006.01)
*H01L 23/00* (2006.01)
(Continued)

(52) U.S. Cl.
CPC ........ *H01L 25/0652* (2013.01); *H01L 23/481* (2013.01); *H01L 24/09* (2013.01);
(Continued)

(58) Field of Classification Search
CPC .................................................. H01L 25/0652
See application file for complete search history.

(56) References Cited

U.S. PATENT DOCUMENTS

| 3,527,989 A | * | 9/1970 | Cuzner | ................... H01L 25/03 361/688 |
| 4,403,238 A | * | 9/1983 | Clark | .................... H01L 25/043 257/459 |

(Continued)

FOREIGN PATENT DOCUMENTS

| JP | 2002368348 A | 12/2002 |
| WO | WO-2008013673 A2 | 1/2008 |
| WO | WO-2018125486 A1 | 7/2018 |

OTHER PUBLICATIONS

"International Application Serial No. PCT/US2017/063663, International Search Report dated Mar. 9, 2018", 3 pgs.

(Continued)

*Primary Examiner* — Victoria K. Hall
(74) *Attorney, Agent, or Firm* — Schwegman Lundberg & Woessner, P.A.

(57) ABSTRACT

Discussed generally herein are devices that can include multiple stacked dice electrically coupled to dice electrically coupled to a peripheral sidewall of the stacked dice and/or a dice stack electrically coupled to a passive die. In one or more embodiments a device can include a dice stack comprising at least two dice including a first die and a second die, the first die electrically connected to and on a second die, a first side pad on, or at least partially in, a first sidewall of the dice stack, a third die electrically connected to the first die at a first surface of the third die and through the first side pad, and a fourth die electrically connected to the third die at a second surface of the first die, the second side opposite the first side.

17 Claims, 6 Drawing Sheets

(51) Int. Cl.
   *H01L 23/48* (2006.01)
   *H01L 27/06* (2006.01)
   *H01L 27/08* (2006.01)
(52) U.S. Cl.
   CPC ...... *H01L 27/0617* (2013.01); *H01L 27/0805* (2013.01); *H01L 2224/09183* (2013.01); *H01L 2225/06513* (2013.01); *H01L 2225/06541* (2013.01)

(56) References Cited

U.S. PATENT DOCUMENTS

| | | | | |
|---|---|---|---|---|
| 4,727,410 | A * | 2/1988 | Higgins, III | H01L 23/13 174/538 |
| 4,868,712 | A * | 9/1989 | Woodman | H01L 23/5385 361/689 |
| 5,051,865 | A * | 9/1991 | Kato | H01L 23/36 361/718 |
| 5,218,515 | A * | 6/1993 | Bernhardt | H01L 23/473 257/712 |
| 5,426,566 | A * | 6/1995 | Beilstein, Jr. | H01L 25/0652 257/686 |
| 5,561,593 | A * | 10/1996 | Rotolante | H01L 23/49827 257/686 |
| 5,567,654 | A * | 10/1996 | Beilstein, Jr. | H01L 23/49827 257/E21.705 |
| 5,568,356 | A * | 10/1996 | Schwartz | G06F 13/4095 200/1 R |
| 5,719,438 | A * | 2/1998 | Beilstein, Jr. | H01L 23/49827 257/686 |
| 5,728,972 | A * | 3/1998 | Hsu | H01L 23/13 174/526 |
| 6,008,530 | A * | 12/1999 | Kano | H01L 23/3107 257/685 |
| 6,133,626 | A * | 10/2000 | Hawke | H01L 25/0652 257/685 |
| 6,380,616 | B1 * | 4/2002 | Tutsch | H01L 25/0652 257/686 |
| 6,433,413 | B1 * | 8/2002 | Farrar | H01L 23/4822 257/678 |
| 6,469,901 | B1 * | 10/2002 | Costner | G06F 1/18 361/730 |
| 6,472,746 | B2 * | 10/2002 | Taniguchi | H01L 25/0657 257/723 |
| 6,686,654 | B2 * | 2/2004 | Farrar | H01L 25/0652 257/685 |
| 6,861,287 | B2 * | 3/2005 | Farrar | H01L 25/0652 257/E25.011 |
| 6,975,027 | B2 * | 12/2005 | Farrar | H01L 23/42 257/712 |
| 7,465,608 | B1 * | 12/2008 | Farrar | H01L 23/4822 257/E23.014 |
| 7,508,061 | B2 * | 3/2009 | Kang | G11C 5/04 257/668 |
| 7,605,458 | B1 * | 10/2009 | Rahman | H01L 25/0657 257/686 |
| 7,687,400 | B2 * | 3/2010 | Trezza | H01L 24/12 438/685 |
| 7,759,685 | B2 * | 7/2010 | Rather | B81B 7/02 257/416 |
| 7,999,383 | B2 * | 8/2011 | Hollis | H01L 23/5227 257/758 |
| 8,236,610 | B2 * | 8/2012 | Hsu | H01L 21/6836 438/113 |
| 8,299,592 | B2 * | 10/2012 | Suh | H01L 23/481 257/276 |
| 8,587,088 | B2 * | 11/2013 | Seroff | H01L 25/0657 257/532 |
| 8,802,497 | B2 * | 8/2014 | Hsu | H01L 21/6836 438/109 |
| 8,841,752 | B1 * | 9/2014 | Chaware | H01L 23/562 257/620 |
| 9,136,251 | B2 * | 9/2015 | Cheah | H01L 24/05 |
| 9,478,524 | B2 | 10/2016 | Cheah et al. | |
| 9,905,461 | B2 * | 2/2018 | Hollis | H01L 23/5381 |
| 10,217,728 | B2 * | 2/2019 | Appelt | H01L 25/0652 |
| 10,785,863 | B2 * | 9/2020 | Trulli | H01L 21/4882 |
| 2001/0010396 | A1 * | 8/2001 | Ichinose | H01L 25/0652 257/723 |
| 2002/0159237 | A1 * | 10/2002 | Patel | H01L 23/427 361/719 |
| 2003/0042153 | A1 * | 3/2003 | Farrar | H01L 25/0652 206/100 |
| 2003/0042599 | A1 * | 3/2003 | Farrar | H01L 25/0652 257/723 |
| 2003/0042616 | A1 * | 3/2003 | Farrar | H01L 25/065 257/777 |
| 2003/0090883 | A1 * | 5/2003 | Asahi | H01L 21/6835 361/761 |
| 2005/0168961 | A1 * | 8/2005 | Ono | H01L 25/0652 361/784 |
| 2007/0278641 | A1 * | 12/2007 | Trezza | H01L 24/16 257/686 |
| 2008/0315388 | A1 * | 12/2008 | Periaman | H01L 25/0652 257/690 |
| 2008/0315409 | A1 * | 12/2008 | Cordes | H01L 25/0655 257/737 |
| 2010/0187676 | A1 * | 7/2010 | Suh | H01L 25/0657 257/692 |
| 2013/0015578 | A1 * | 1/2013 | Thacker | H01L 24/13 257/738 |
| 2013/0075915 | A1 * | 3/2013 | Kim | H01L 24/73 257/773 |
| 2013/0320565 | A1 * | 12/2013 | Griswold | H01L 25/0655 257/777 |
| 2013/0341803 | A1 * | 12/2013 | Cheah | H01L 23/3142 257/774 |
| 2014/0030900 | A1 * | 1/2014 | Leigh | H01L 25/0652 439/196 |
| 2014/0091473 | A1 * | 4/2014 | Len | H01L 25/0657 257/774 |
| 2014/0159253 | A1 * | 6/2014 | Liao | H01L 23/5386 257/777 |
| 2015/0262902 | A1 * | 9/2015 | Shen | H01L 21/56 438/107 |
| 2016/0005718 | A1 * | 1/2016 | Cheah | H01L 23/3142 257/774 |
| 2017/0084577 | A1 * | 3/2017 | Carney | H01L 25/0655 |
| 2018/0114773 | A1 * | 4/2018 | Chiu | H01L 24/24 |

OTHER PUBLICATIONS

"International Application Serial No. PCT/US2017/063663, Written Opinion dated Mar. 9, 2018", 6 pgs.

Cheah, Bok Eng, et al., "Modeling and Electrical Characteristics Evaluation of Vertical Side-Chip Interconnection for Compact 3D Integration", (2011), 7 pgs.

* cited by examiner

STACKED DICE SYSTEMS

CLAIM OF PRIORITY

This patent application is a U.S. National Stage Filing under 35 U.S.C. 371 from International Application No. PCT/US2017/063663, filed Nov. 29, 2017, which claims the benefit of priority to Malaysian Application Serial No. PI 2016704874, filed Dec. 29, 2016, each of which are incorporated by reference herein in their entirety.

TECHNICAL FIELD

This disclosure relates generally to electronic dies and electronic die packages.

BACKGROUND ART

Semiconductor dies are often coupled to other circuitry in an electronic system through a substrate. The substrate includes interconnect circuitry that routes power and/or data between other electrical components and the semiconductor die that is coupled to the substrate. Due to the constant pressure for smaller and higher performance devices, improvements in interconnect circuitry, such as on-die coupling and power supply noise, are desired to permit the miniaturization of components, and improve performance and manufacturability of components such as semiconductor dies and substrates.

DESCRIPTION OF THE EMBODIMENTS

Figure 1:
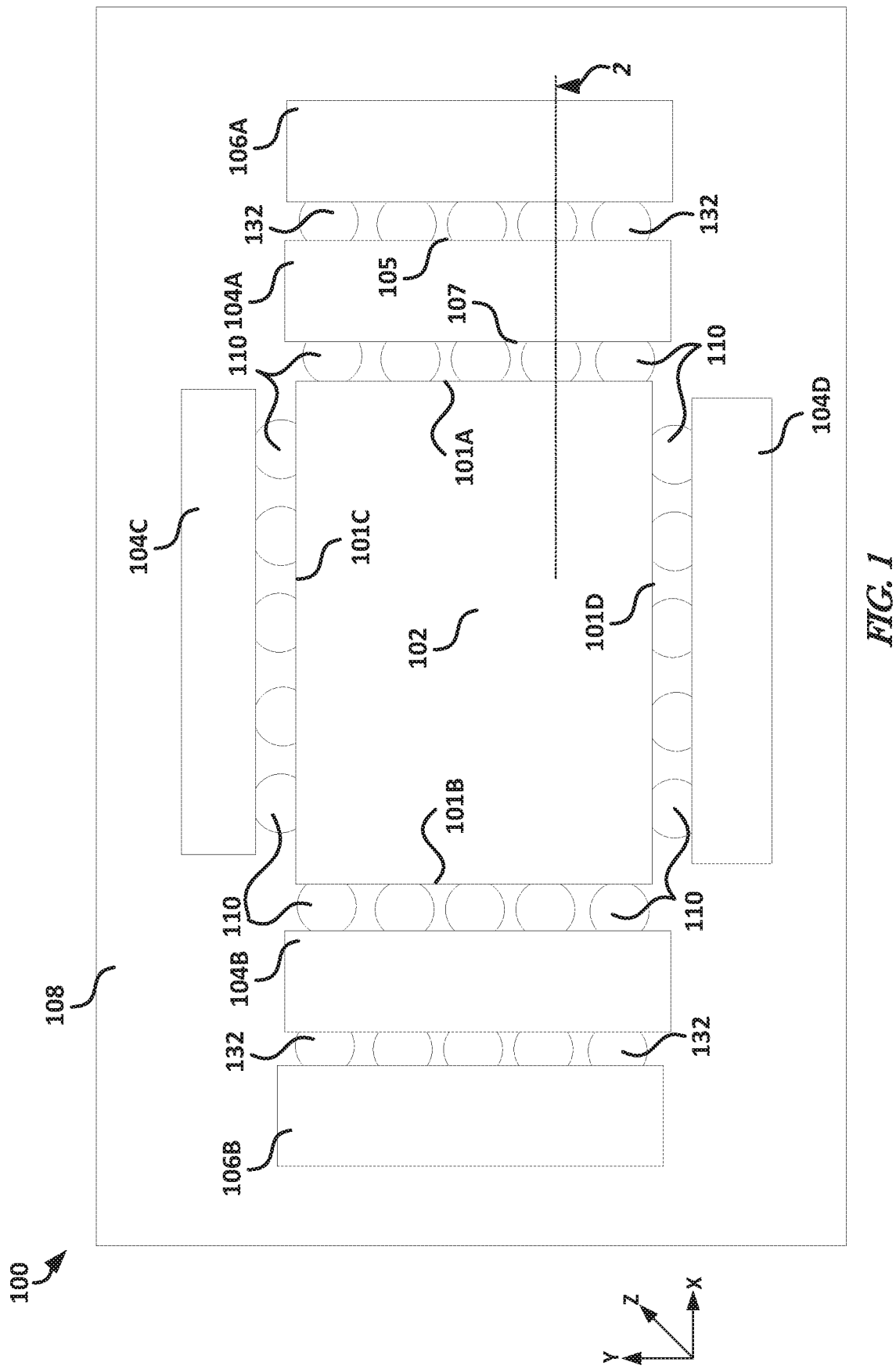
FIG. 1 illustrates, by way of example, a top view diagram of an embodiment of a 3D stacked die package.

The following description and the drawings sufficiently illustrate specific embodiments to enable those skilled in the art to practice them. Other embodiments can incorporate structural, logical, electrical, process, or other changes. Portions and features of some embodiments can be included in, or substituted for, those of other embodiments. Embodiments set forth in the claims encompass all available equivalents of those claims.

One or more embodiments discussed herein can help address one or more challenges of electronic device form—factor miniaturization, while coping with demands to further improve system performance and/or functionality. Platform or motherboard real-estate can be required to integrate various functional electrical components (e.g., central processing unit (CPU), platform controller hub (PCH), flash memory, sensors, optical, and/or radio frequency (RF) radio), such as through multiple discrete packages.

One or more embodiments can help reduce a wafer fabrication process throughput time and/or assembly costs. The improvements can be due, at least in part, to a power delivery solution to improve system jitter (signaling noise) and/or overall channel margins, such as through one or more dedicated capacitance sources (e.g., through a centralized metal-in-metal capacitor (MIMCap) device or devices) one or more of the dice or packages. The MIMCap device(s) can help improve wafer fabrication throughput time and/or costs.

Platform architectures can help integrate various functional devices. Current platform architectures can include a three-dimensional (3D) stacked die and/or package. Such platform architectures can include a mixed-stacked package that includes top and bottom dies attached to each other (at their inactive sides) by a dielectric adhesive and electrically connected to a dielectric substrate, such as through solder connections (the bottom die) and wire bonds (the top die). In such mixed-stacked packages, the two stacked dies can be surrounded by a dielectric mold material, such as for electric isolation. A 3D stacked package is similar to a mixed-stacked package with the top die being electrically connected to the substrate using through silicon vias (TSVs) that include electrical conductors through the bottom die. A package-on-package (POP) architecture includes two package substrates connected to each other. Such POP architectures can include a Thru Mold Via (TMV) to provide electrical signals to a bottom package substrate through a mold of the bottom package. Other POP architectures can include solder connections between substrate package pads on a bottom side of a top package and on a top side of a bottom package.

Discussed herein are embodiments that include a 3D stacked die package that includes a plurality of stacked dice. The stacked dice can be electrically connected or coupled to one or more dice that are electrically coupled to one or more peripheral sidewalls of the stacked dice. One or more of the dice coupled to the peripheral sidewalls can supply electrical capacitance(s) (e.g., through a MIMCap region) to at least one of the stacked dice and/or dice electrically coupled to the one or more peripheral sidewalls.

One or more embodiments can provide one or more of the following advantages, such as compared to previous multi-chip packages, such as 3D stacked die package designs: (i) Device form-factor miniaturizations, such as through reduced package and/or platform footprint (e.g., in the x-direction and/or y-direction) through using a unique 3D stacking of dice; (ii) Enhanced device functionalities, such as through intensified component integration and/or data processing capacity through "side chips" (e.g., stacked side chips); (iii) Improved electrical performance, such as through signaling and power integrity (signal jitter and/or power supply noise reduction) through larger and/or dedicated capacitance source (e.g., a centralized MIMCap component); (iv) Allowing system bus or interconnects bandwidth scaling; and (v) Reduced wafer fabrication process throughput time and/or costs, such as through centralized stacked silicon MIMCap component(s).

FIG. 1 illustrates, by way of example, a top view diagram of an embodiment of a 3D stacked die package 100. The package 100 as illustrated includes a dice stack 102 and dice 104A, 104B, 104C, 104D, 106A, and 106B electrically coupled to the dice stack 102. One or more of the dice 104A-D and 106A-B can be stacked (e.g., in the x-direction or y-direction as illustrated in FIG. 1). The dice stack 102 can include dice electrically coupled to each other and on each other (e.g., in the z-direction as illustrated in FIG. 1). One or more of the dice 104A-D can be passive. One or more of the dice 104A-D can include routing and/or MIMCaps. One or more of the dice 106A-B and/or dice of the dice stack 102 can be active dice.

The dice 104A-D can include respective metallization layers with sides electrically coupled to peripheral sidewalls 101A, 101B, 101C, and 101D, respectively, of the dice stack 102, such as through electrical adhesive material 110. The electrical adhesive material 110 can provide an electrical path between dice connected thereby. The electrical adhesive 110 can include an electrical solder, conductive paste, conductive film (e.g. anisotropic conductive film), glue, or the like. The electrical adhesive 110 can be connected between respective electrical pads of the dice stack 102 and the dice 104A-D and/or 106A-B. The dice 106A-B can be electrically connected to the dice 104A-B, respectively, such as through an electrical adhesive 132. The electrical adhesive 132 can be made of a same or different material as the electrical adhesive 110.

While FIG. 1 illustrates the package 100 as including four dice 104A-D, one dice attached to each sidewall 101A-D of the dice stack 102, the package may include from one to four of such dice. While FIG. 1 illustrates the package 100 as including two dice 106A-B at a second tier of dice stacked on the dice stack 102, the package may include from zero to four of such dice.

One or more of the dice in the dice stack 102 and/or one or more of the dice 104A-D and 106A-B can be electrically coupled to electrical interconnects in the substrate 108. In one or more embodiments, the dice 106A-B can be active dice. The difference between an active die and a passive die, is that an active die requires power to operate, while a passive die does not require power to operate.

The dice of the dice stack 102, the dice 104A-D, and/or the dice 106A-B can include one or more transistors, resistors, capacitors, oscillators, radios, antennas, sensors, voltage, current, or power regulators, diodes, inductors, arithmetic logic units (ALUs), amplifiers, modulators, demodulators, phase-locked loops (PLLs), central processing units (CPUs), memory, platform controller hubs (PCNs), optical components, or the like. The dice 104A-D and/or the dice 106A-B can be housed in a package that includes pads attached thereto that can provide access to the functionality of the dice 104A-D and/or 106A-B.

The dice 104A-D as illustrated include opposing first and second major surfaces 107 and 105. The first surface 107 faces the dice stack 102 (e.g., a sidewall of the dice stack 102). The second surface 105 faces away from the dice stack 102. In embodiments that include a second tier die 1064-B, the second surface 105 faces the second tier die 106A-B. The dice 104A-D include a side facing the substrate 108. The dice 104A-D can include a sidewall pad on the side facing the substrate 108.

Figure 2:
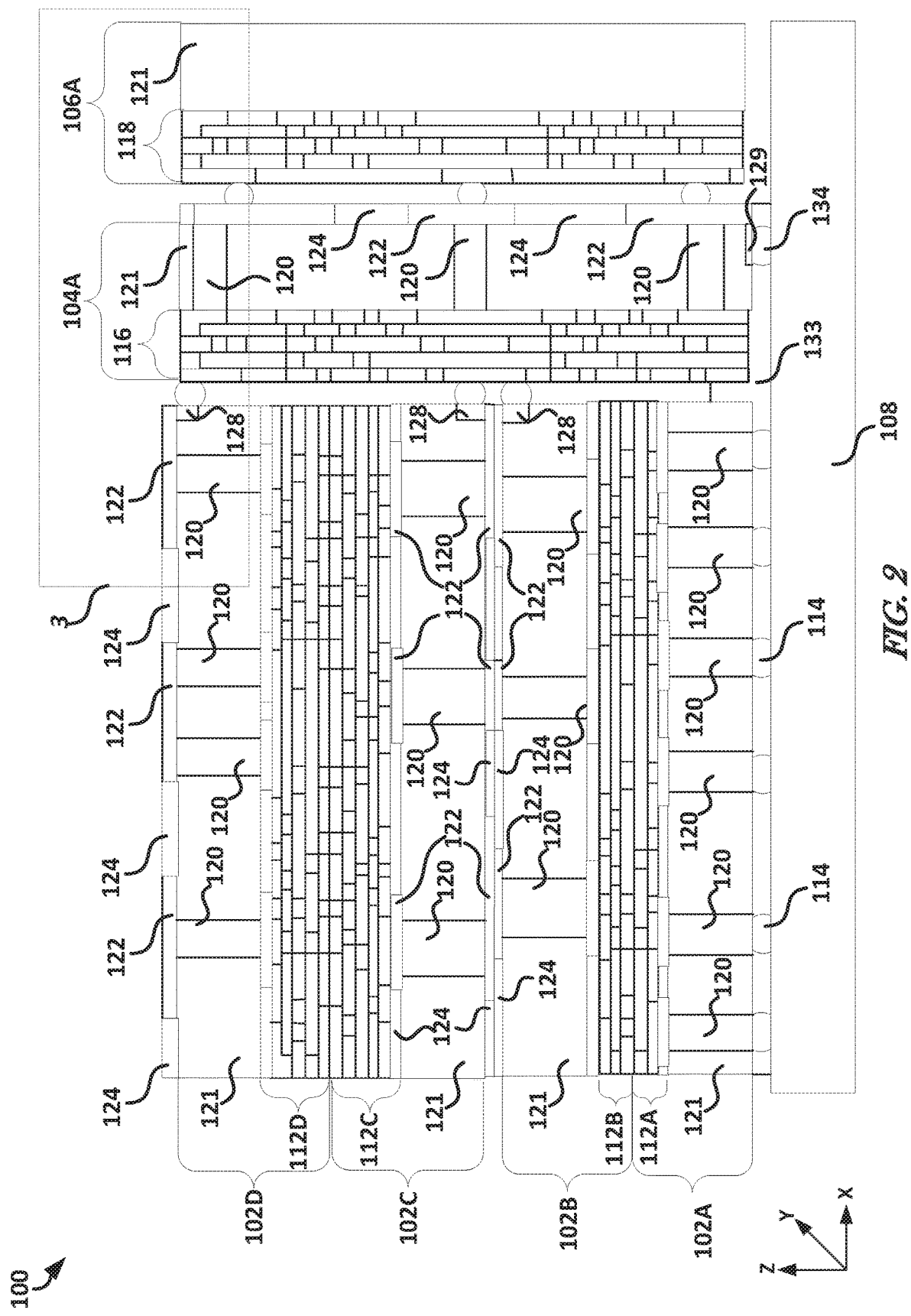
FIG. 2 illustrates, by way of example, a cross-section view diagram of a portion of the package of FIG. 1 from the perspective of the dashed line labelled "2" in FIG. 1.

FIG. 2 illustrates, by way of example, a cross-section view diagram of a portion of the package 100 from the perspective of the dashed line labelled "2" in FIG. 1. The view is from the direction of the arrow labelled "2". The package 100 as illustrated includes a plurality of stacked dice 102A, 102B, 102C, and 102D. The dice stack 102 includes the stacked dice 102A-D. The cross-section view of the package 100 as illustrated in FIG. 2 includes two dice 104A and 106A stacked and electrically coupled to the stacked dice 102A-D. The stacked dice 102A-D can be electrically coupled to the substrate 108, such as through an electrical connection 114, such as can include a flip chip, sometimes referred to as C4 (controlled collapse chip connection) bump, solder connection. While the dice stack 102 is illustrated as including the dice 102A-D, the dice stack 102 can include two or more stacked dice.

Each of the stacked dice 102A-D includes a respective active region 112A, 112B, 112C, and 112D. Each of the active regions 112A-D includes alternating dielectric and metallization layers that are electrically coupled to a transistor gate layer. The dielectric layers include primarily dielectric material with one or more conductive vias extending therethrough. The metallization layers include conductive material formed as traces, pads, planes, or the like, with dielectric material separating portions of the conductive material. The vias, traces, pads, planes, and other conductive material are examples of interconnect circuitry.

On each of the active regions 112A-D is a silicon region 121 that includes through silicon vias (TSVs) 120 therethrough. Each of the stacked dice 102A-D includes an active region 112A-D, respectively, and a silicon region 121 on the active region 112A-D. The stacked die 102A (the die on the bottom of the stack or the die closest to the substrate 108) includes the silicon region 121 between the substrate 108 and the active die region 112A.

Active regions 112C-D of dies 102C-D that are stacked on each other can be electrically connected, such as by surface activated bonding or conductive material (e.g. anisotropic conductive film or solder bump). The active region 112C, as illustrated, is electrically connected to the active region 112D. The active region 112A, as illustrated, is electrically connected to the active region 112B. The silicon regions 121 of dies 102B-C that are stacked on each other can be electrically connected, such as through pads 122. The pads 122 can be separated from each by a passivation material 124. The passivation material 124 can include silicon dioxide, carbon-doped oxide or other material. The dielectric layers of the active regions 112A-D or MIMCap layers 116 can include silicon dioxide or other dielectric material. The dielectric material can be chosen or designed based on a desired capacitance value achieved from the placing the dielectric between two conductive plates, such as for the MIMCaps. Generally, the higher a dielectric constant of a material, the higher the capacitance value (assuming the distance between the plates and the area of the plates remains constant).

Each of the dice 102A-D includes sidewall pads 128 electrically connected to conductive material of the die 104A. The conductive material of the die 104A can include a pad connected to a trace or a conductive plate of a MIMCap. The sidewall pads 128 are on the sidewall 101A of the dice stack 102.

The die 104A includes MIMCap layers 116 and a silicon region 121. The MIMCap layers 116 can include routing and MIMCaps in alternating metallization and dielectric layers. The MIMCap layers 116 are described in more detail with regard to FIG. 3. The die 104A is electrically connected to the dice stack 102 through the sidewall pads 128. The die 104A, as illustrated, is electrically connected to an electrical interconnect of the substrate 108 through a sidewall pad 129 and an electrical connection 134. The electrical connection 134 may include materials similar to the electrical connection 114, such as can include a C4 solder bump connection.

The die 106A includes an active region 118 and a silicon region 121. The active region 118 is similar to the active regions 112A-D, with the active region 118 being oriented generally perpendicular to the active regions 112A-D.

Figure 3:
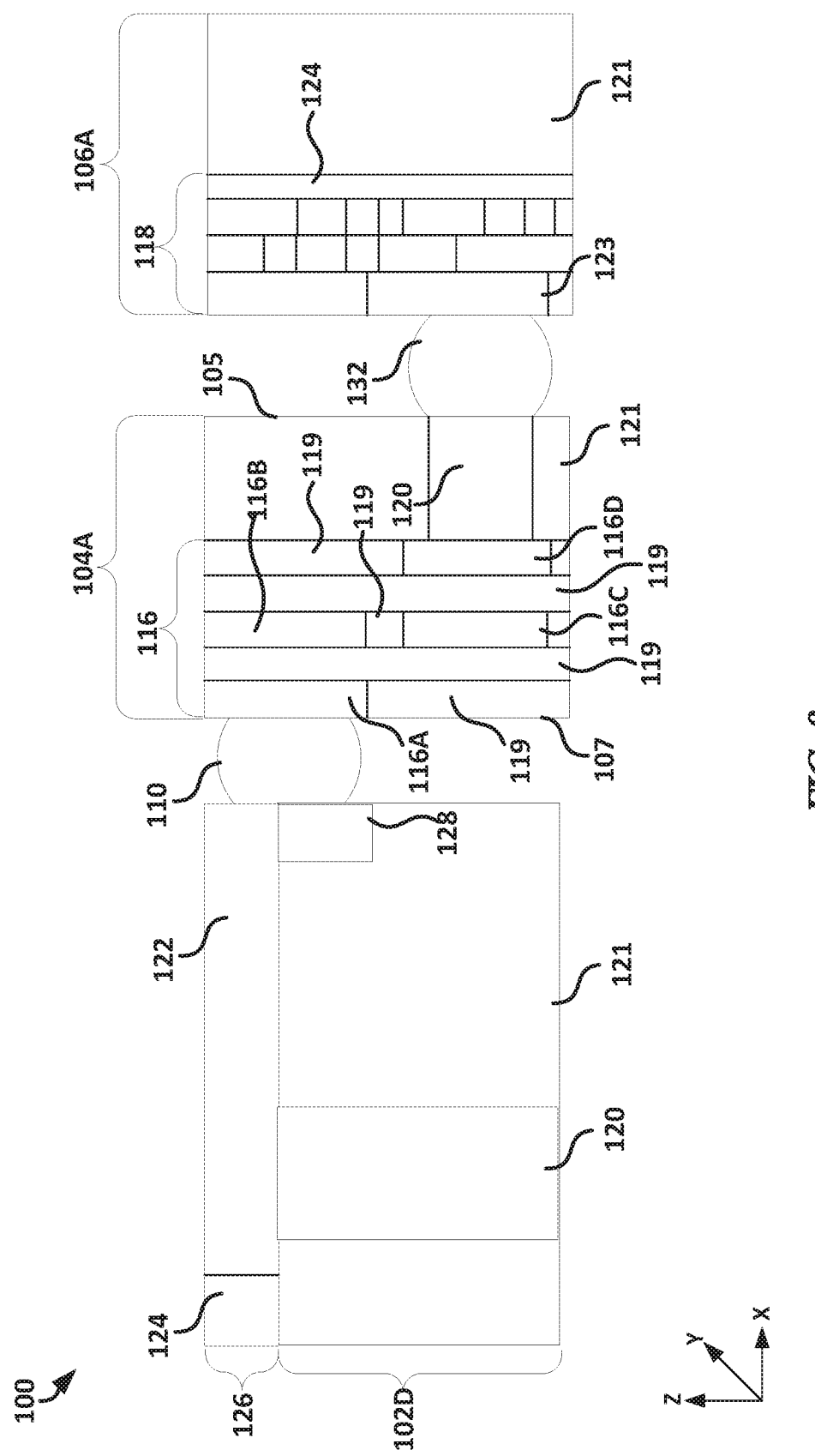
FIG. 3 illustrates, by way of example, an exploded view diagram of a portion of the package of FIG. 1 that includes the region within the dashed box labelled "3" in FIG. 2.

FIG. 3 illustrates, by way of example, an exploded view diagram of a portion of the package 100 that includes the region within the dashed box labelled "3" in FIG. 2. The portion of the package 100 of FIG. 3 is illustrated as including the die 102D, a backside metallization 126, the die 104A, and the die 106A. The die 102D is the top die of the dice stack 102. The die 104A is electrically connected to the die 102D through a sidewall pad 128 and a MIMCap plate 116A. The die 106A is electrically connected to the die 104A through the TSV 120, the pad 123, and conductive adhesive 132.

The MIMCap layer 116 as illustrated includes a plurality of MIMCap plates 116A, 116B, 116C, and 116D separated by dielectric 119. The MIMCap layer 116 can include alternating layers of MIMCap plates 116A-D and dielectric 119. Two MIMCap plates 116A-B or 116C-D in sufficient proximity and separated by the dielectric 119 form a MIMCap. Signals from the die 106A can be routed through one or more MIMCaps of the die 104A and to the dice stack 102. A capacitance value of a MIMCap can be controlled by a thickness of the dielectric 119 separating the plates 116A-D and the surface area of the plates 116A-D. The plates 116A and 116C can be positively charged and the plates 116B and 116D can be negatively charged (or vice versa). The MIMCaps can help improve electrical performance (e.g., signaling and/or power integrity), such as through jitter and/or noise reduction.

Different regions of the MIMCap layer 116 can serve different layers of the dice stack 102. For example, a region of the MIMCap layer 116 that is most proximal the side pad(s) 128 of the die 102C can provide MIMCap(s) for that die. In one or more embodiments, a region of the MIMCap layer 116 can serve multiple dice 102A-D. In one or more embodiments, a signal generated in a die 102A-D of the dice stack 102 can be routed to the die 104A, through one or more MIMCaps and back to the same or a different die 102A-D, such as through the die 104A. In one or more embodiments, the die 104A may additionally or alternatively serve as a routing die, sometimes referred to as a silicon bridge. In such embodiments, a die, for example the die 102D, may transmit a signal to the die 102B through routing in the die 104A without going through a MIMCap of the die 104A.

A dielectric underfill material 133 can be situated between the die 102A and the substrate 108. The underfill material 133 can help prevent shorts between conductive paths.

Figure 5:
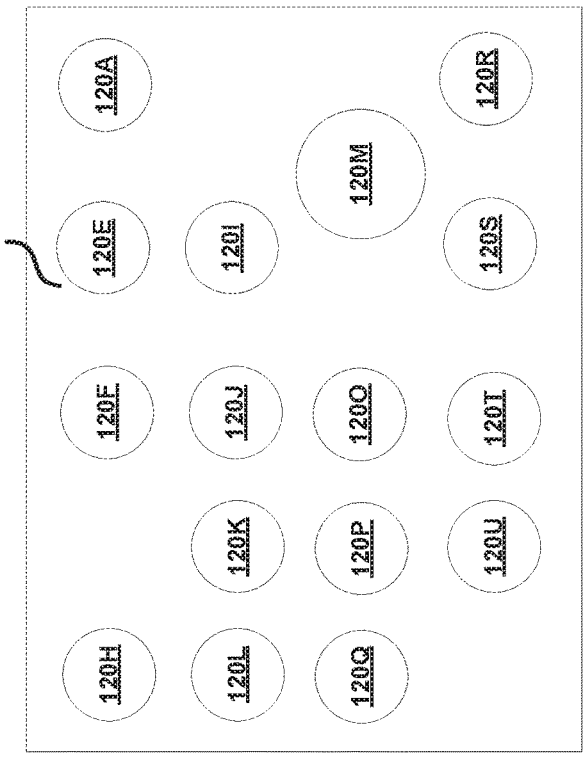
FIG. 5 illustrates, by way of example, a perspective view diagram of an embodiment of a second side of the die from FIG. 4 from the direction opposite of the arrow labelled "x".
Figure 4:
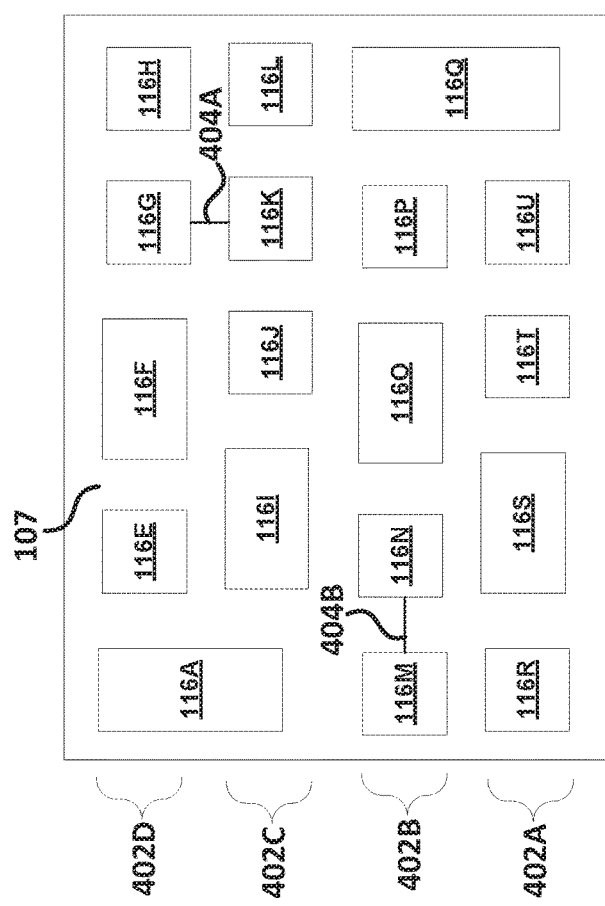
FIG. 4 illustrates, by way of example, a perspective view diagram of an embodiment of a first side of a die of FIG. 1 from the direction indicated by the arrow labelled "x".

FIG. 4 illustrates, by way of example, a perspective view diagram of an embodiment of a first side 107 of the die 104A from the direction indicated by the arrow labelled "x" as shown in FIG. 3. FIG. 5 illustrates, by way of example, a perspective view diagram of an embodiment of a second side 105 of the die 104A from the direction opposite of the arrow labelled "x". The first side 107 includes a plurality of capacitor plates 116A, 116E, 116F, 116G, 116H, 116I, 116J, 116K, 116L, 116M, 116N, 116O, 116P, 116Q, 116R, 116S, 116T, and/or 116U. The rows 402A, 402B, 402C, and 402D indicate which of the respective dice 102A, 102B, 102C, and 102D the capacitors associated with the respective plate 116A and 116E-U serves. For example, in one or more embodiments, the capacitor plates 116A and 116E-116H can be electrically connected to electrical connections of the die 102D.

The second side 105, as illustrated, includes a plurality of TSVs 120A, 120E, 120F, 120H, 120I, 120J, 120K, 120L, 120M, 120O, 120P, 120Q, 120R, 120S, 120T, and 120U. The plurality of TSVs 120A-U are patterned to connect with corresponding pads 123 of the die 106A.

The MIMCaps can be connected in series, parallel, or to service multiple dice of the dice stack 102, such as can be provided using the connections 404A-B. For example, the connection 404A allows a signal originating from the row 402D to be provided to the row 402C. In another example, the connection 404B allows a signal to go through a parallel capacitance created from the MIMCaps that include the capacitor plates 116M and 116N. The vias in the MIMCap layer allow signals to be routed to respective MIMCaps and/or MIMCaps to be connected in series.

Any of the conductive materials, such as the electrical interconnects e.g., pads, sidewall pads, TSVs, traces, planes), electrical adhesives, plates, or others, can include a metal, such as aluminum, gold, silver, copper, platinum, other conductive metal, or a combination thereof.

Figure 6:
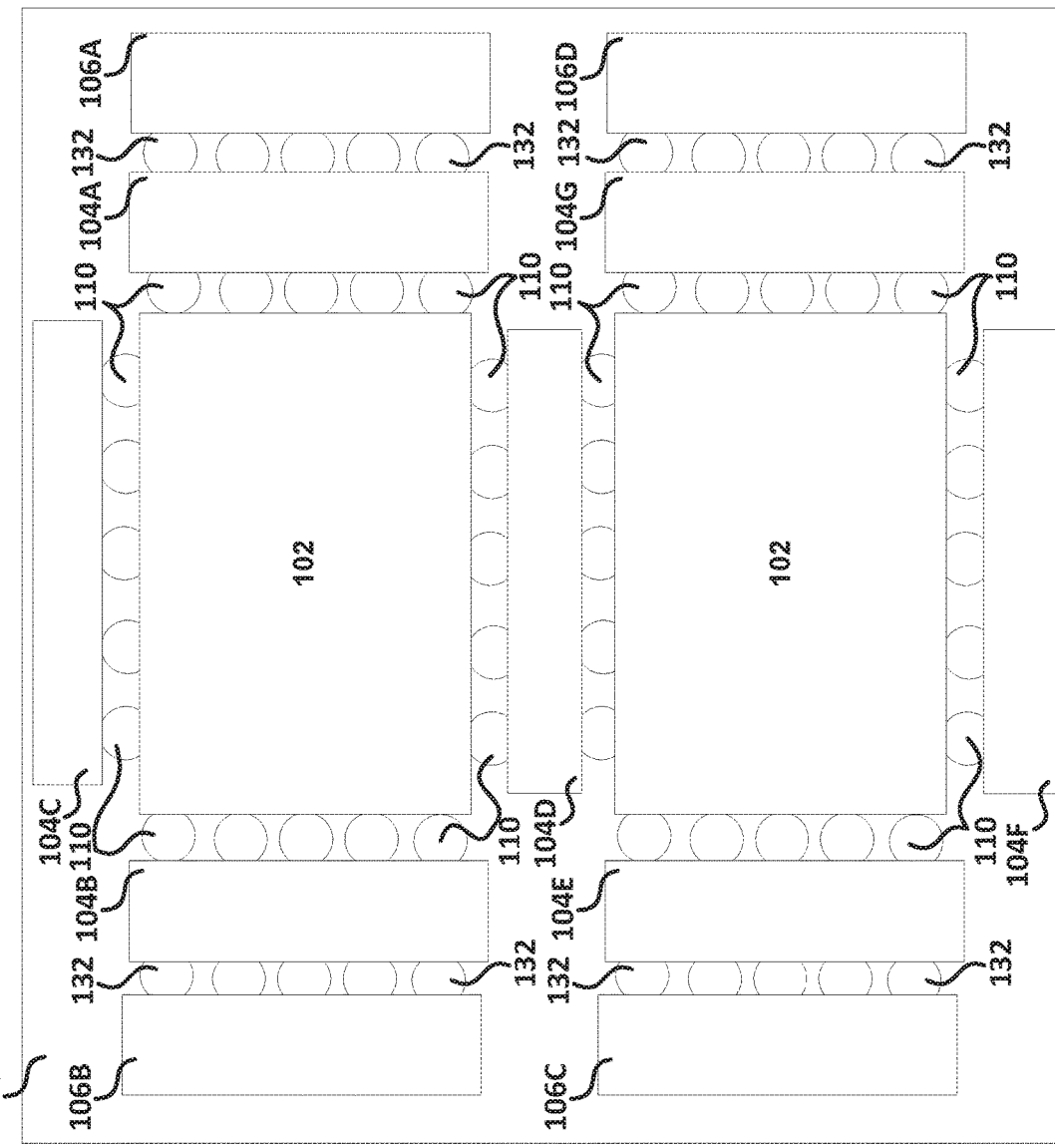
FIG. 6 illustrates, by way of example, a top view diagram of an embodiment of a 3D stacked die package.

FIG. 6 illustrates, by way of example, a perspective view diagram of an embodiment of a 3D stacked die package 600. The package 600 is similar to the package 100 with the package 600 including first and second dice stacks 102. The dice stacks 102 are electrically coupled to each other through the die 104D. The die 104D, in one or more embodiments, is a passive die, such as can include MIMCaps (e.g., similar to the die 104A shown in FIG. 3). Each of the dice stacks 102 includes two tiers of stacked dice on opposite sidewalls thereof. For example, the first dice stack 102 includes first tier dice 104A-D and second tier dice 106A-B and the second dice stack 102 includes first tier dice 104D, 104E. 104F, and 104G and second tier dice 106C and 106D. Note that while the FIGS. illustrate two tiers of dice stacked on the dice stack, more tiers are possible, such as can include three, four, five, six, or even more tiers of dice stacked on the dice stack 102.

The dice 104A-G and 106A-D are coupled to the first and second dice stacks 102 through the sidewall pads 128 and electrical adhesive 110. In one or more embodiments, one or more of the dice 104A-D, such as 104A is configured to provide on-die electrical capacitance to one or more of a plurality of dice, such as dice in the dice stack 102 (e.g., dice 102A-D) via metal-in-metal capacitor (MIMCap) embedded in MIMCap layers 116. The MIMCap comprises of metal plates and/or planes (e.g., the plates 116A-D) associated with opposite voltage polarities (e.g., ground (Vss) and power (Vcc)) with a dielectric layer 119 in between the metal plates 116A-D of a capacitor. The thickness of the dielectric layer 119, in one or more embodiments may range from 10 nm-40 nm. In one or more embodiments, the metal plate thickness may range from 1 μm-5 μm. The dimensions of metal plate, dielectric constant $\varepsilon_r$, and the thickness of the dielectric material may be configured according to a desired capacitance output.

In one or more embodiments, the stacked MIMCap die 104A supplies the on-die capacitance to the plurality of stacked dice 102A-102D through the electrical adhesive 110. The MIMCap die 104A may be configured to align in accordance to the position or respective heights of the individual dice 102A-102D. For example, the row 402A-D can align with a height of a respective die 102A-D in a dice stack 102. The on-die capacitance delivery from the die 104A to the second tier die 106A can be facilitated through a TSV 120 and electrical adhesive 132.

The physical foot-print or dimension of the first tier die 104A-G may be equivalent or smaller compared to a foot-print of a sidewall 101A-D of the dice stack 102. Similarly, the second tier die 106A-D can include a footprint that is equivalent or smaller to a foot-print of a sidewall 101A-D of the dice stack 102. In one or more embodiments, the second tier die 106A-D and/or one or more of the dice 102A-D of the dice stack 102 may be a secondary stacked MIMCap die, such as can be similar to the die 104A of FIG. 3. The die 104A-D may be coupled to the package substrate 108 through electrical adhesive 134, such as for power supply delivery.

Figure 7:
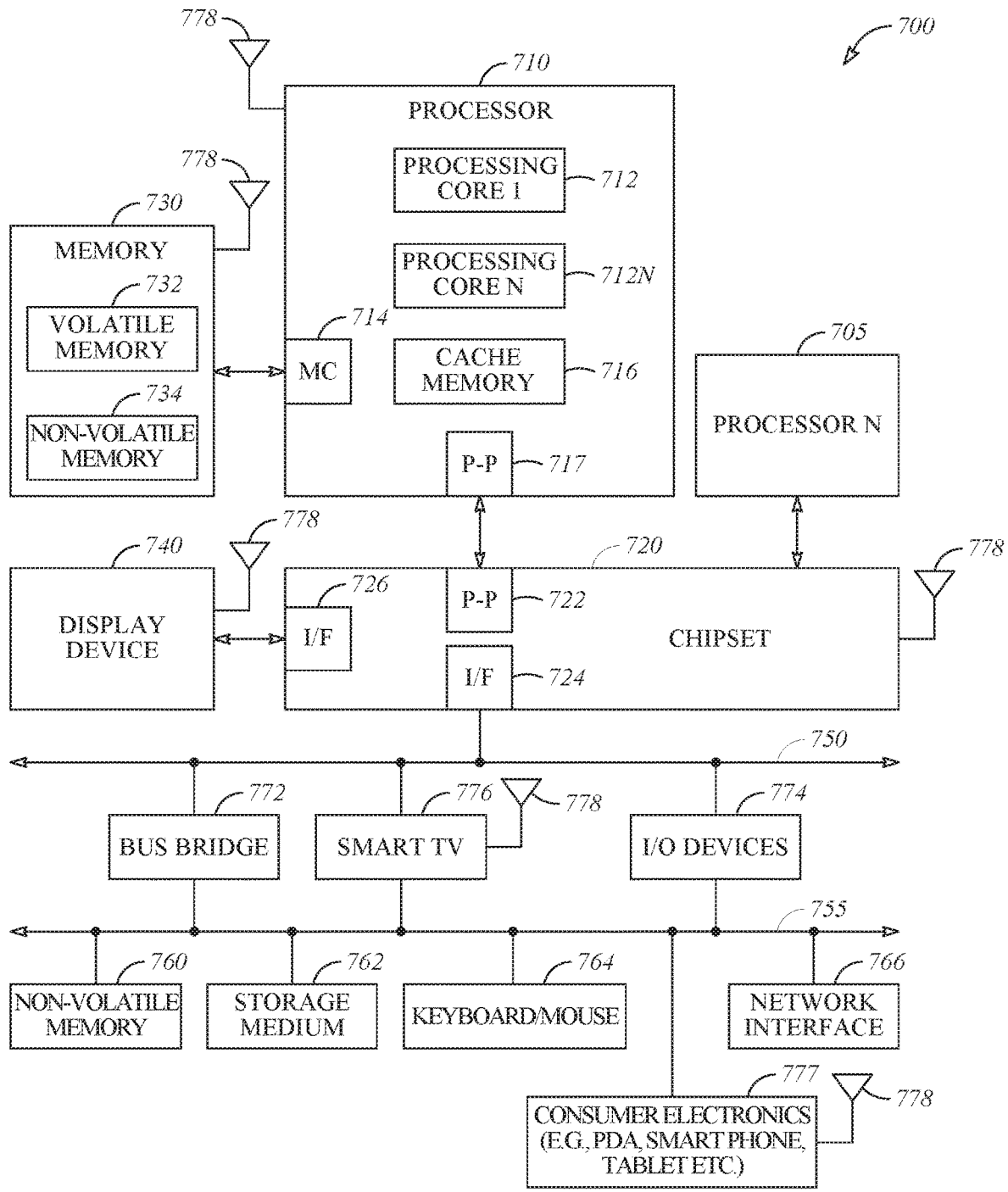
FIG. 7 illustrates, by way of example, a block diagram of an embodiment of an electronic device that can include one or more embodiments of packages discussed herein.

An example of an electronic device using one or more 3D stacked dice packages is included to show an example of a device application for the present disclosure. FIG. 7 illustrates, by way of example, a block diagram of an embodiment of a system 700 that includes components that can be included in or connected to a device or system discussed herein. The system 700 is merely one example of a device in which embodiments of the present disclosure can be used. Examples of systems 700 include, but are not limited to, personal computers, tablet computers, supercomputers, servers, telecommunications switches, routers, mobile telephones, personal data assistants, MP3 or other digital music players, radios, etc.

In one embodiment, processor 710 has one or more processor cores 712 and 712N, where 712N represents the Nth processor core inside processor 710 where N is a positive integer. In one embodiment, system 700 includes multiple processors including 710 and 705, where processor 705 has logic similar or identical to the logic of processor 710. In some embodiments, processing core 712 includes, but is not limited to, pre-fetch logic to fetch instructions, decode logic to decode the instructions, execution logic to execute instructions and the like. In some embodiments, processor 710 has a cache memory 716 to cache instructions and/or data for system 700. Cache memory 716 may be organized into a hierarchal structure including one or more levels of cache memory.

In some embodiments, processor 710 includes a memory controller 714, which is operable to perform functions that enable the processor 710 to access and communicate with memory 730 that includes a volatile memory 732 and/or a non-volatile memory 734. In some embodiments, processor 710 is coupled with memory 730 and chipset 720. Processor 710 may also be coupled to a wireless antenna 778 to communicate with any device configured to transmit and/or receive wireless signals. In one embodiment, an interface for wireless antenna 778 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory 730 stores information and instructions to be executed by processor 710. In one embodiment, memory 730 may also store temporary variables or other intermediate information while processor 710 is executing instructions. In the illustrated embodiment, chipset 720 connects with processor 710 via. Point-to-Point (PtP or P-P) interfaces 717 and 722. Chipset 720 enables processor 710 to connect to other elements in system 700. In some embodiments of the example system, interfaces 717 and 722 operate in accordance with a PtP communication protocol such as the Intel® QuickPath Interconnect (QPI) or the like. In other embodiments, a different interconnect may be used.

In some embodiments, chipset 720 is operable to communicate with processor 710, 705N, display device 740, and other devices, including a bus bridge 772, a smart TV 776, I/O devices 774, nonvolatile memory 760, a storage medium (such as one or more mass storage devices) 762, a keyboard/mouse 764, a network interface 766, and various forms of consumer electronics 777 (such as a PDA, smart phone, tablet etc.), etc, In one embodiment, chipset 720 couples with these devices through an interface 724. Chipset 720 may also be coupled to a wireless antenna 778 to communicate with any device configured to transmit and/or receive wireless signals.

Chipset 720 connects to display device 740 via interface 726. Display 740 may be, for example, a liquid crystal display (LCD), a plasma display, cathode ray tube (CRT) display, or any other form of visual display device. In some embodiments of the example system, processor 710 and chipset 720 are merged into a single SOC. In addition, chipset 720 connects to one or more buses 750 and 755 that interconnect various system elements, such as I/O devices 774, nonvolatile memory 760, storage medium 762, a keyboard/mouse 764, and network interface 766. Buses 750 and 755 may be interconnected together via a bus bridge 772.

In one embodiment, mass storage device 762 includes, but is not limited to, a solid state drive, a hard disk drive, a universal serial bus flash memory drive, or any other form of computer data storage medium. In one embodiment, network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

In one embodiment, mass storage device 762 includes, but is not limited to, a solid state drive, a hard disk drive, a universal serial bus flash memory drive, or any other form of computer data storage medium. In one embodiment, network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the components shown in FIG. 7 are depicted as separate blocks within the system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into processor core 712.

Additional Notes and Examples

In Example 1 a device includes a dice stack comprising at least two dice including a first die and a second die, the first die electrically connected to and on a second die, a first side pad on, or at least partially in, a first sidewall of the dice stack, a second side pad on, or at least partially in, the first sidewall of the dice stack, a third die electrically connected to the first and second dice at a first surface thereof through the first and second side pads, respectively, and a fourth die electrically connected to the third die at a second surface thereof, the second side opposite the first side.

In Example 2, the device of Example 1 includes, wherein the third die is a passive die.

In Example 3, the device of at least one of Examples 1-2 includes, wherein the first, second, and third dice are active dice.

In Example 4, the device of at least one of Examples 1-3 includes, wherein the third die includes a plurality of metal-in-metal capacitors (MIMCaps) and interconnect routing.

In Example 5, the device of at least one of Examples 1-4 includes a third side pad on, or at least partially in, a second sidewall of the dice stack, and a fifth die electrically connected to the first die at a first side of the fifth die through the third side pad.

In Example 6, the device of Example 5 includes, wherein the fifth die is a passive die.

In Example 7, the device of Example 6 includes, a sixth die electrically connected to the fifth die at a second side of the fifth die, the second side of the fifth die opposite the first side of the fifth die.

In Example 8, the device of Example 7 includes, wherein the sixth die is an active die.

In Example 9, the device of at least one of Examples 1-8 includes a substrate, wherein the second die is electrically connected to at least one electrical interconnect of the substrate through a pad on, or at least partially in, a surface of the second die that is opposite a surface of the second die on which the first die is situated.

In Example 10, the device of Example 9 includes, wherein the third die is electrically connected to the substrate through a third side pad of the third die.

In Example 11, the device of at least one of Examples 1-10 includes, wherein the third die is electrically connected to the first and second side pads through an active surface thereof and wherein the active surface is generally perpendicular to a surface of the third die on which the third side pad resides.

In Example 12 a package includes a first dice stack comprising at least two dice including a first die and a second die, the first die electrically connected to and on the second die, a first side pad on, or at least partially in, a first sidewall of the first dice stack, a second side pad on, or at least partially in, the first sidewall of the first dice stack, a second dice stack comprising at least two dice including a third die and a fourth die, the third die electrically connected to and on the fourth die, a third side pad on, or at least partially in, a first sidewall of the second dice stack, a fourth side pad on, or at least partially in, the first sidewall of the second dice stack, a fifth die electrically connected to the first and second dice at a first surface thereof through the first and second side pads, respectively, and the fifth die electrically connected to the third and fourth dice at a second surface thereof through the third and fourth side pads, respectively, the first surface of the fifth die opposite the second surface of the fifth die, wherein the fifth die is a passive die and the first, second, third, and fourth dice are active dice.

In Example 13, the package of Example 12 includes, wherein the fifth die includes a plurality of metal-in-metal capacitors (MIMCaps) and interconnect routing.

In Example 14, the package of at least one of Examples 12-13 includes a fifth side pad on, or at least partially in, a second sidewall of the first dice stack, and a sixth die electrically connected to the first die at a first side of the sixth die through the fifth side pad.

In Example 15, the package of Example 14 includes, wherein the sixth die is a passive die.

In Example 16, the package of Example 15 includes a seventh die electrically connected to the sixth die at a second side of the sixth die, the second side of the sixth die opposite the first side of the sixth die.

In Example 17, the package of Example 16 includes, wherein the seventh die is an active die.

In Example 18, the package of at least one of Examples 12-17 includes, a substrate, wherein the second die is electrically connected to at least one electrical interconnect of the substrate through a pad on, or at least partially in, a surface of the second die that is opposite a surface of the second die on which the first die is situated, and wherein the fourth die is electrically connected to at least one electrical interconnect of the substrate through a pad on, or at least partially in, a surface of the fourth die that is opposite a surface of the fourth die on which the third die is situated.

In Example 19, the package of at least one of Examples 12-18 includes, wherein the fifth die is electrically connected to the substrate through a fifth side pad of the fifth die.

In Example 20, the package of at least one of Examples 12-19 includes, wherein the fifth die is electrically connected to the first and second side pads through an active surface thereof and wherein the active surface is generally perpendicular to a surface of the fifth die on which the fifth side pad resides.

In Example 21 a device includes a dice stack comprising a plurality of stacked, active dice including a first die and a second die, the first die comprising an active region and a silicon region with through silicon vias (TSVs) therethrough, the second die comprising an active region and a silicon region with TSVs therethrough, first and second side pads on a first sidewall of the dice stack, and a third die electrically connected to the first and second dice through the first and second side pads, respectively, the third die including a metal-in-metal capacitor (MIMCap) region including a plurality of MIMCaps, one or more of the MIMCaps in an electrical path to the first die and one or more of the MIMCaps in an electrical path to the second die.

In Example 22, the device of Example 21 includes a fourth die electrically coupled to the first die through a MIMCap of the plurality of MIMCaps, wherein the fourth die is electrically connected to the third die at a surface of the third die facing away from the dice stack.

In Example 23, the device of Example 22 includes, wherein the fourth die is an active die.

In Example 24, the device of at least one of Examples 22-23 includes, wherein the third die further comprises a silicon region on the MIMCap region with TSVs extending through the silicon region thereof, and wherein the fourth die is electrically connected to the first die through one or more of the TSVs of the third die.

In Example 25, the device of at least one of Examples 21-24 includes, wherein the active region of the first die faces and is electrically connected to the active region of the second die.

In Example 26, the device of Example 25 includes a third side pad on, or at least partially in, a second sidewall of the dice stack, and a fifth die electrically connected to the first die at a first side of the fifth die through the third side pad.

In Example 27, the device of Example 26 includes, wherein the fifth die is a passive die.

In Example 28, the device of Example 27 includes a sixth die electrically connected to the fifth die at a second side of the fifth die, the second side of the fifth die opposite the first side of the fifth die.

In Example 29, the device of Example 28 includes, wherein the sixth die is an active die.

In Example 30, the device of at least one of Examples 21-29 includes a substrate, wherein the second die is electrically connected to at least one electrical interconnect of the substrate through a pad on, or at least partially in, a surface of the second die that is opposite a surface of the second die on which the first die is situated.

In Example 31, the device of Example 30 includes, wherein the third die is electrically connected to the substrate through a third side pad of the third die.

In Example 32, the device of at least one of Examples 21-31 includes, wherein the third die is electrically connected to the first and second side pads through an active surface thereof and wherein the active surface is generally perpendicular to a surface of the third die on which the third side pad resides.

The above description of embodiments includes references to the accompanying drawings, which form a part of the description of embodiments. The drawings show, by way of illustration, specific embodiments in which the invention can be practiced. These embodiments are also referred to herein as "examples," Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein," Also, in the following claims, the terms "including" and "comprising" are open-ended that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above description of embodiments, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the description of embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A device comprising:
    a vertical dice stack comprising at least two dice including a first die and a second die, the first die electrically connected to and on a second die;
    a first side pad on, or at least partially in, a first sidewall of the vertical dice stack;
    a second side pad on, or at least partially in, the first sidewall of the vertical dice stack;
    a third die electrically connected to the first and second dice at a first surface of the third die through the first and second side pads, respectively; and
    a fourth die electrically connected to the third die at a second surface of the third die, the second surface opposite the first surface;
    wherein the third die is a passive die that includes a plurality of metal-in-metal capacitors (MIMCaps) and interconnect routing.

2. The device of claim 1, wherein the first, second, and fourth dice are active dice.

3. The device of claim 1, further comprising:
    a third side pad on, or at least partially in, a second sidewall of the vertical dice stack; and
    a fifth die electrically connected to the first die at a first surface of the fifth die through the third side pad.

4. The device of claim 3, wherein the fifth die is a passive die.

5. The device of claim 4, further comprising a sixth die electrically connected to the fifth die at a second surface of the fifth die, the second surface of the fifth die opposite the first surface of the fifth die.

6. The device of claim 5, wherein the sixth die is an active die.

7. The device of claim 1, further comprising a substrate, wherein the second die is electrically connected to at least one electrical interconnect of the substrate through a pad on, or at least partially in, a surface of the second die that is opposite a surface of the second die on which the first die is situated.

8. The device of claim 7, wherein the third die is electrically connected to the substrate through a third side pad of the third die.

9. A package comprising:
    a first vertical dice stack comprising at least two dice including a first die and a second die, the first die electrically connected to and on the second die;
    a first side pad on, or at least partially in, a first sidewall of the first vertical dice stack;
    a second side pad on, or at least partially in, the first sidewall of the first vertical dice stack;
    a second vertical dice stack comprising at least two dice including a third die and a fourth die, the third die electrically connected to and on the fourth die;
    a third side pad on, or at least partially in, a first sidewall of the second vertical dice stack;

a fourth side pad on, or at least partially in, the first sidewall of the second vertical dice stack;

a fifth die electrically connected to the first and second dice at a first surface of the fifth die and through the first and second side pads, respectively, and the fifth die electrically connected to the third and fourth dice at a second surface of the fifth die through the third and fourth side pads, respectively, the first surface of the fifth die opposite the second surface of the fifth die, wherein the fifth die is a passive die and the first, second, third, and fourth dice are active dice.

10. The package of claim 9, wherein the fifth die includes a plurality of metal-in-metal capacitors (MIMCaps) and interconnect routing.

11. The package of claim 9, further comprising:
a fifth side pad on, or at least partially in, a second sidewall of the first vertical dice stack; and
a sixth die electrically connected to the first die at a first surface of the sixth die through the fifth side pad.

12. The package of claim 11, wherein the sixth die is a passive die.

13. The package of claim 12, further comprising a seventh die electrically connected to the sixth die at a second surface of the sixth die, the second surface of the sixth die opposite the first surface of the sixth die.

14. A device comprising:
a vertical dice stack comprising a plurality of stacked, active dice including a first die and a second die, the first die comprising an active region and a silicon region with through silicon vias (TSVs) therethrough, the second die comprising an active region and a silicon region with TSVs therethrough;
first and second side pads on a first sidewall of the vertical dice stack; and
a third die electrically connected to the first and second dice through the first and second side pads, respectively, the third die including a metal-in-metal capacitor (MIMCap) region including a plurality of MIMCaps, one or more of the MIMCaps in an electrical path to the first die and one or more of the MIMCaps in an electrical path to the second die.

15. The device of claim 14, further comprising:
a fourth die electrically coupled to the first die through a MIMCap of the plurality of MIMCaps, wherein the fourth die is electrically connected to the third die at a surface of the third die facing away from the vertical dice stack.

16. The device of claim 15, wherein the fourth die is an active die.

17. The device of claim 16, wherein the third die further comprises a silicon region on the MIMCap region with through silicon vias (TSVs) extending through the silicon region thereof, and wherein the fourth die is electrically connected to the first die through one or more of the TSVs of the third die.

* * * * *